United States Patent [19]

Grehl

[11] Patent Number: 5,309,494
[45] Date of Patent: May 3, 1994

[54] CIRCUIT CONFIGURATION FOR GENERATING LOGICAL BUTTERFLY STRUCTURES

[75] Inventor: Udo Grehl, München, Fed. Rep. of Germany

[73] Assignee: Siemens Aktiengesellschaft, Munich, Fed. Rep. of Germany

[21] Appl. No.: 967,680

[22] Filed: Oct. 26, 1992

[30] Foreign Application Priority Data

Oct. 25, 1991 [DE] Fed. Rep. of Germany ....... 4135318

[51] Int. Cl.⁵ ................. H03K 21/02; H03K 21/08; H03M 13/00
[52] U.S. Cl. ..................................... 377/39; 377/55; 377/56; 307/463
[58] Field of Search ............................ 377/39, 55, 56; 307/463

[56] References Cited

U.S. PATENT DOCUMENTS

| 2,949,228 | 8/1960 | Bailey et al. | 377/39 |
| 3,134,091 | 5/1964 | Shugart | 377/39 |
| 3,265,867 | 8/1966 | Venn et al. | 377/39 |

OTHER PUBLICATIONS

IEEE Custom Integrated Circuits Conference, 1987, J. Stahl & A. Meyr: "A Bit Serial Viterbi Decoder Chip for the MBIT/S Range", pp. 551-554.

*Primary Examiner*—John S. Heyman
*Attorney, Agent, or Firm*—Herbert L. Lerner; Laurence A. Greenberg

[57] ABSTRACT

A circuit configuration includes k linking cells each generating one of k output states from two of k input states. Each of the linking cells have two counters. Each of the counters have a serial data input, a serial data output, and a serial counting width input. The counters increase a counter state loaded through the data input and represent the respectively assigned input state by a value input through the counting width input. Comparators are each connected to the data outputs of two of the counters for serially comparing the two counter states with one another. Multiplexers are each connected to the data outputs of two of the counters for outputting one of the two counter states as an output state under the control of the comparator. Each two further multiplexers are connected upstream of the respective counters and are switched through for loading the counter states with the respectively assigned input states and for comparing the counter states at the data outputs with the counter states at the data inputs of the respective counters.

4 Claims, 2 Drawing Sheets

CIRCUIT CONFIGURATION FOR GENERATING LOGICAL BUTTERFLY STRUCTURES

The invention relates to a circuit configuration in which k linking cells each generate one of k output states from two of k input states.

Digital data transmission through satellite and mobile radio channels requires transmission methods that utilize the available bandwidth and transmission capacity effectively. The effectiveness of such methods depends essentially on the decoding process being used. Given suitable transmission signal encoding, the so-called Viterbi algorithm represents one optimal decoding process in the sense of the maximum likelihood criterion.

The Viterbi algorithm is based in principle on a path search in a diagram, the so-called trellis diagram, which reproduces all of the possible changes in state of a given code between predetermined times. The path that was most likely taken in the encoding is sought, according to the maximum likelihood principle. The metrical spacing, which is called a metric for short, is used as a measure of the likelihood of a path. The metric spacing between a received code word and each possible code word, each corresponding to a pass, is ascertained at the transition from a time k to a short time k+1, which is also known as respective levels k and k+1. According to the maximum likelihood principle, the likelihood is highest at minimum metrics. The path with the smallest metric is called the survivor.

The decoding using the Viterbi algorithm can be divided into two phases, namely a forward phase and a reverse phase. In the forward phase, information on the likelihood of each individual transition is collected. Since two paths each lead to a new state, the survivor is selected, that is the path having the smaller metric. The survivor is encoded with a bit, a logical "0" is assigned to one path and a logical "1" is assigned to the other. In the reverse phase, the information is reconstructed from the survivor encodings.

The state transitions between two levels form regular, logical structures, known as butterfly structures, which enable relatively simply constructed circuit elements to be used in a decoder that operates by the Viterbi algorithm. In principle, both parallel and serial processing are possible. On one hand, parallel processing permits higher data rates as compared with serial processing, but on the other hand it entails greater expense for circuitry, which in turn leads to higher power consumption. Serial processing is therefore preferred, particularly in applications in the mobile radio field.

A serial circuit configuration for generating logical butterfly structures is known, for instance from a paper by J. Stahl and A. Meyr, entitled "A Bit Serial Viterbi Decoder Chip for MBit/S Range", in IEEE Custom Integrated Circuits Conference, 1987, pp. 551–554. That circuit configuration, which is also called a bit serial add-compare-select cell, includes two serial full adders, each for adding one of the two old metrics to a branch metric characteristic of the particular path. A number of memory elements, each forming one shift register, are connected downstream of the two full adders. These two shift registers each lead to a multiplexer which switches through one of them depending on a control signal. The control signal is generated by a serial comparator, which compares the outcomes of the two additions, delayed by one place, with one another and then delivers that to the multiplexer, delayed by one place.

The disadvantages of such devices are the necessity for added expense for circuitry to achieve more-complex control functions, and the vulnerability of the outcome to error.

It is accordingly an object of the invention to provide a circuit configuration for generating logical butterfly structures, which overcomes the hereinafore-mentioned disadvantages of the heretofore-known devices of this general type.

With the foregoing and other objects in view there is provided, in accordance with the invention, a circuit configuration, comprising k linking cells each generating one of k output states from two of k input states; each of the linking cells having two counters; each of the counters having a serial data input, a serial data output, and a serial counting width input, and the counters increasing a counter state loaded through the data input and representing the respectively assigned input state by a value input through the counting width input; comparators each being connected to the data outputs of two of the counters for serially comparing the two counter states with one another; multiplexers each being connected to the data outputs of two of the counters for outputting one of the two counter states as an output state under the control of the comparator; and further multiplexers, each two of the further multiplexers being connected upstream of the respective counters and being switched through for loading the counter states with the respectively assigned input states and for comparing the counter states at the data outputs with the counter states at the data inputs of the respective counters.

In accordance with another feature of the invention, each of the counters has a number of series-connected memory cells for performing shifting operations or counting operations as a function of a control state.

In accordance with a further feature of the invention, each of the memory cells includes a first inverter having an input and having an output forming the data output of the memory cell, a second inverter having an input connected to the output of the first inverter and having an output, first and second transistors having gate terminals each being connected to a respective clock line and having source-to-drain paths, a third transistor having a gate terminal connected to a counting width input line and having a source-to-drain path connected in series with the source-to-drain path of the second transistor, a third inverter having an output connected through the source-to-drain path of the first transistor to the input of the first inverter and having an input connected through the series-connected source-to-drain paths of the second and third transistors to the output of the second inverter, a fourth transistor having a source-to-drain path connected between a data input line and the input of the third inverter and having a gate terminal connected to a further clock line, fifth and sixth transistors of opposite conduction types having source-to-drain paths being connected in parallel between the gate terminal of the third transistor and a counting width output line and having gate terminals each being connected to the output of a respective one of the first and second inverters, and a seventh transistor having a source-to-drain path connected between the counting width output line and a reference potential and having a gate terminal connected to the output of the second inverter.

In accordance with a concomitant feature of the invention, there are provided fourth and fifth inverters each being connected anti-parallel to a respective one of the first and third inverters.

Other features which are considered as characteristic for the invention are set forth in the appended claims.

Although the invention is illustrated and described herein as embodied in a circuit configuration for generating logical butterfly structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
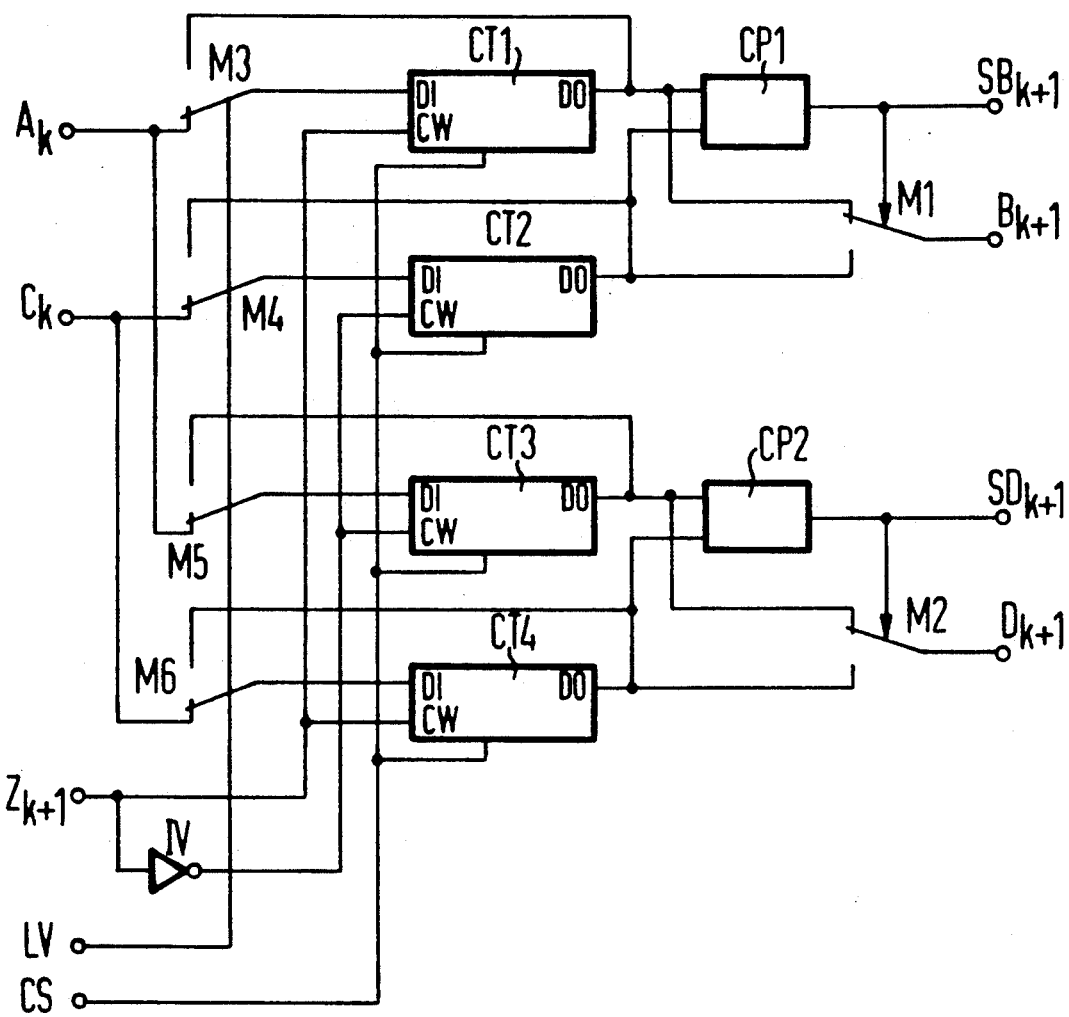
FIG. 1 is a schematic and block diagram of a first, generalized embodiment of a circuit configuration according to the invention for two metrics.

Referring now to the figures of the drawing in detail and first, particularly, to FIG. 1 thereof, there is seen a circuit configuration which includes k=2 linking cells, each of which generates one of two output states from two input states. The linking cells each have two counters CT1, CT2 and CT3, CT4, respectively. One counter state at a time, that is loaded through a serial data input DI, is increased by a value which is input through a serial counting width input CW. A respective comparator CP1 and CP2 is also connected to a serial data output DO of each corresponding counter CT1, CT2 and CT3, CT4, for serially comparing the two counter states with one another. The data outputs DO of the two corresponding counters CT1, CT2 and CT3, CT4 are also followed by respective multiplexers M1 and M2, which act under the control of the respective comparators CP1 and CP2 to output one of two counter states $B_{k+1}$ and $D_{k+1}$. Two further multiplexers M3, M4 and M5, M6, which are respectively connected upstream of the respective counters CT1, CT2 and CT3, CT4, switch through either the data outputs DO or a respectively assigned input state $A_k$, $C_k$ thereof. The values that are input through the respective counting width inputs CW are produced from a branch metric unit $Z_{k+1}$, in such a way that the branch metric value $Z_{k+1}$ is applied directly to the counting width inputs CW of the counters CT1 and CT3 of a branch metric unit $Z_{k+1}$, and is applied to the counting inputs CW of the counters CT2 and CT4 with the interposition of an inverter IV. The control of the multiplexers M3–M6 is performed by means of a signal LV, and the control of the counters CT1 through CT4 is performed by means of a signal CS.

Figure 2:
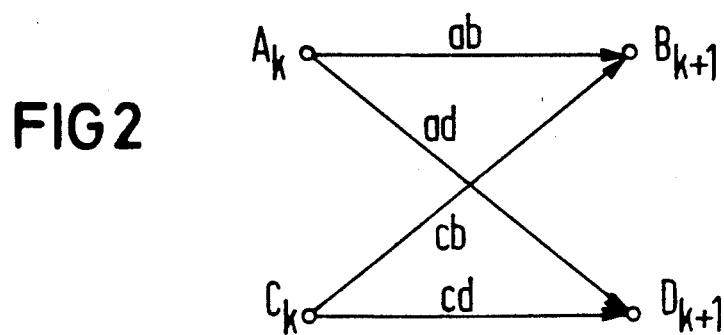
FIG. 2 is a trellis diagram of the circuit configuration of FIG. 1.

The trellis diagram of the circuit configuration of FIG. 1, which is shown in FIG. 2, includes two states $A_k$ and $C_k$ of a level k, which will be referred to below as the old metric, and two states $B_{k+1}$, $D_{k+1}$ of levels k+1, which will be referred to below as the new metric. The state $B_{k+1}$ results from the states $A_k$ and $C_k$, in accordance with the state transition ab and cb, respectively. Correspondingly, the state $D_{k+1}$ is the result of the states $A_k$ and $C_k$, by means of the transitions ad and cd, respectively.

Figure 3:
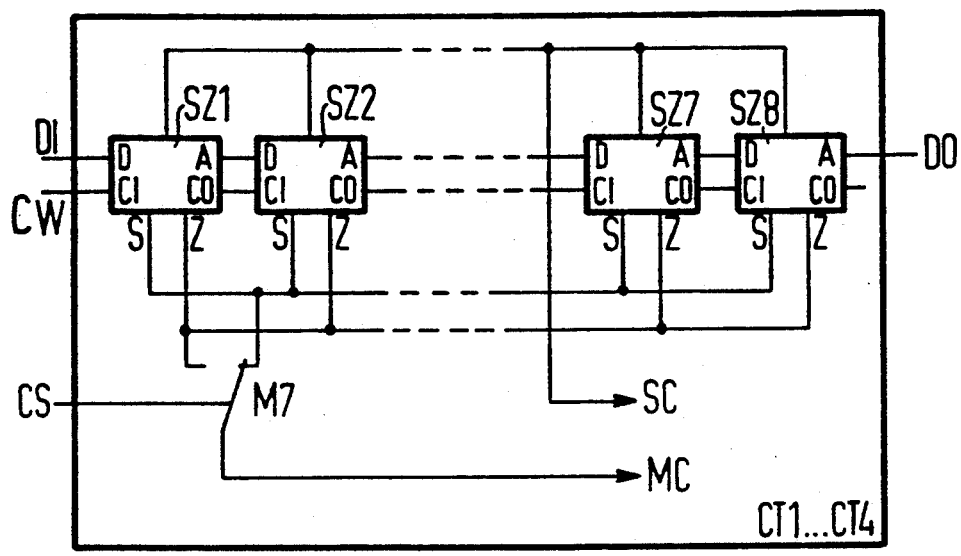
FIG. 3 is a schematic and block diagram of an embodiment of a counter in a circuit configuration according to the invention.

In the exemplary embodiment shown in FIG. 3, each of the counters CT1-CT4 has a number of series-connected memory cells SZ1-SZ8, which are each connected in series with respect to not only data inputs D and data outputs A but also with respect to counting width inputs CI and counting width outputs CO. The data input of the first memory cell SZ1 forms the data input DI of the applicable counter CT1-CT4, and the data output A of the last memory cell SZ8 forms the data output DO of the applicable counter CT1-CT4. The counting width input CI of the first memory cell SZ1 is also provided as the counting width input CW of the applicable counter CT1-CT4. A master clock MC is imposed on a shift mode input S or on a counting mode input Z through a multiplexer M7, as a function of the control signal CS. The corresponding counter CT1-CT4 executes shift or counting operations, depending on whether the master clock is applied to the shift mode input S or the counting mode input Z. The memory cells SZ1 are also acted upon by a slave clock SC.

Figure 4:
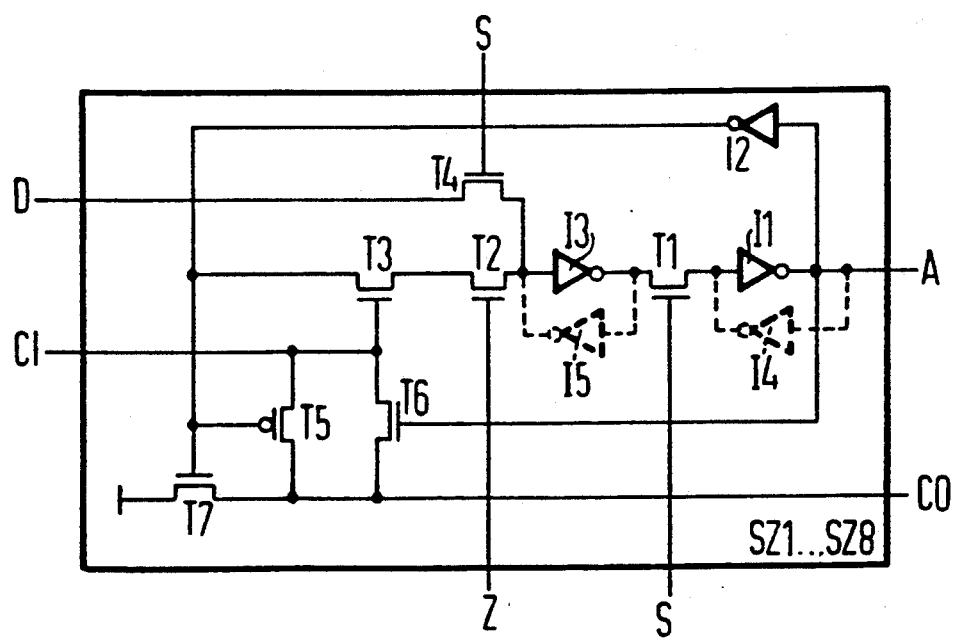
FIG. 4 is a further schematic and block diagram of an embodiment of a counter in a circuit configuration according to the invention.

The memory cells SZ1-SZ8 of the counters CT1-CT4 seen in FIG. 4 each contain an inverter I1 having an output which forms the data output A of the applicable memory cell, another inverter I2 having an input which is connected to the output of the one inverter I1, and two MOS field effect transistors T1 and T2 each having a gate terminal that forms a respective one of the shift or counting mode inputs S, Z and are therefore selectively acted upon by the master clock MC. The gate terminal of an MOS field effect transistor T3 is connected to a counting width input line CI. An inverter I3 has an output which is connected to the input of the inverter I1 through the source-to-drain path of the transistor T1. The inverter I3 has an input which is connected to the output of the inverter I2 through the series-connected source-to-drain paths of the transistors T2, T3. A transistor T4 has a source-to-drain path which is connected between a data input line D and the input of the inverter I3 and the transistor T4 has a gate terminal which forms the shift mode input S. Two MOS field effect transistors T5 and T6 with opposite conduction types have parallel-connected source-to-drain paths which are connected between the gate terminal of the transistor T3 and a counting width output line CO, as well as gate terminals which are each connected to the respective outputs of the inverters I1, I2. Thus the transistor T5 is of the p-channel type, while all of the other transistors T1, T2, T3, T4, T6, T7 are of the n-channel type. Finally, an MOS field effect transistor T7 has a source-to-drain path which is connected between the counting width output line CO and a reference potential, as well as a gate terminal which is connected to the output of the inverter I2.

In order to explain the operation of a circuit configuration according to the invention, the following discussion will assume a convolution code often used in mobile radio, for example. In order to calculate deltametrics, the Hamming distance between the code word and the path code is used. The course of the process can be divided into three steps:

First, the old metrics $A_k$ and $C_k$ obtained from the previous course are serially loaded into the corresponding counters CT1, CT3 and CT2, CT4. Next, by counting the counter state, the branch metrics of level k+1 are increased accordingly. This corresponds to an addition of the old metrics $A_k$ and $C_k$ to the branch metrics $Z_{k+1}$. The metrics thus obtained are compared with one another in pairs. The outcomes of the comparison, namely a corresponding survivor $SB_{k+1}$ or $SD_{k+1}$, are stored in memory. The outcome of comparison simultaneously selects the new metrics $B_{k+1}$ and $D_{k+1}$, which are reloaded into the counters CT1–CT4 in the next step. However, aside from the static embodiment of the memory cells SZ1 . . . SZ8 shown thus far, a dynamic embodiment may alternatively be used. The dynamic embodiment is based on the static embodiment, with the inverters I1 and I3 each having a respective inverter I4 and I5 connected anti-parallel thereto, as is shown in dashed lines in FIG. 4.

An advantage of the circuit configurations according to the invention is a lower expenditure for circuitry to achieve control functions, since the logic intended to process the data simultaneously performs the administration of the various metrics. Overall, the circuit layout can be provided more easily as a result, especially because of the great regularity of the structures, which allows very simple embodiments in terms of technical layout. Moreover, as compared with the known process, further simplifications and in particular an elimination of the error involved are obtained.

I claim:

1. A circuit configuration, comprising:
   k linking cells each generating one of k output states from two of k input states;
   each of said linking cells having two counters;
   each of said counters having a serial data input, a serial data output, and a serial counting width input, and said counters increasing a counter state loaded through the data input and representing the respectively assigned input state by a value input through the counting width input;
   comparators each being connected to the data outputs of two of said counters for serially comparing the two counter states with one another;
   multiplexers each being connected to the data outputs of two of said counters for outputting one of the two counter states as an output state under the control of said comparator; and
   further multiplexers, each two of said further multiplexers being connected upstream of said respective counters and being switched through for loading the counter states with the respectively assigned input states and for comparing the counter state at the data outputs with the counter states at the data inputs of said respective counters.

2. The circuit configuration according to claim 1, wherein each of said counters has a number of series-connected memory cells for performing shifting operations or counting operations as a function of a control state.

3. The circuit configuration according to claim 2, wherein each of said memory cells includes:
   a first inverter having an input and having an output forming the data output of said memory cell, a second inverter having an input connected to the output of said first inverter and having an output, first and second transistors having gate terminals each being connected to a respective clock line and having source-to-drain paths,
   a third transistor having a gate terminal connected to a counting width input line and having a source-to-drain path connected in series with the source-to-drain path of said second transistor,
   a third inverter having an output connected through the source-to-drain path of said first transistor to the input of said first inverter and having an input connected through the series-connected source-to-drain paths of said second and third transistors to the output of said second inverter,
   a fourth transistor having a source-to-drain path connected between a data input line and the input of said third inverter and having a gate terminal connected to a further clock line,
   fifth and sixth transistors of opposite conduction types having source-to-drain paths being connected in parallel between the gate terminal of said third transistor and a counting width output line and having gate terminals each being connected to the output of a respective one of said first and second inverters, and
   a seventh transistor having a source-to-drain path connected between the counting width output line and a reference potential and having a gate terminal connected to the output of said second inverter.

4. The circuit configuration according to claim 3, including fourth and fifth inverters each being connected anti-parallel to a respective one of said first and third inverters.

* * * * *